(12) United States Patent
Yoshida et al.

(10) Patent No.: US 7,652,361 B1
(45) Date of Patent: Jan. 26, 2010

(54) LAND PATTERNS FOR A SEMICONDUCTOR STACKING STRUCTURE AND METHOD THEREFOR

(75) Inventors: Akito Yoshida, Chandler, AZ (US);
Mahmoud Dreiza, Phoenix, AZ (US);
James Turner, Murphy, TX (US)

(73) Assignee: Amkor Technology, Inc., Chandler, AZ (US)

( * ) Notice: Subject to any disclaimer, the term of this patent is extended or adjusted under 35 U.S.C. 154(b) by 345 days.

(21) Appl. No.: 11/367,171

(22) Filed: Mar. 3, 2006

(51) Int. Cl.
*H01L 23/02* (2006.01)

(52) U.S. Cl. ............... 257/686; 257/E25.018; 257/685; 257/724; 257/778; 438/107; 438/108

(58) Field of Classification Search .......... 257/E21.503, 257/E23.069, 685, 686, 668, 738, E25.023, 257/724, 700, 774, 778, E25.018; 361/790, 361/792; 438/107–109
See application file for complete search history.

(56) References Cited

U.S. PATENT DOCUMENTS

| | | | | |
|---|---|---|---|---|
| 5,222,014 A * | 6/1993 | Lin | ............... | 361/792 |
| 5,729,894 A * | 3/1998 | Rostoker et al. | ............... | 29/832 |
| 5,748,452 A | 5/1998 | Londa | | |
| 5,763,939 A | 6/1998 | Yamashita | | |
| 5,783,870 A * | 7/1998 | Mostafazadeh et al. | ..... | 257/791 |
| 5,963,430 A * | 10/1999 | Londa | ............... | 361/790 |
| 5,973,393 A | 10/1999 | Chia et al. | | |
| 6,057,596 A * | 5/2000 | Lin et al. | ............... | 257/697 |
| 6,107,685 A | 8/2000 | Nishiyama | | |
| 6,274,929 B1 | 8/2001 | Leong et al. | | |
| 6,376,908 B1 * | 4/2002 | Gaku et al. | ............... | 257/707 |
| 6,388,333 B1 * | 5/2002 | Taniguchi et al. | ............. | 257/777 |
| 6,597,062 B1 * | 7/2003 | Li et al. | ............... | 257/686 |
| 6,617,695 B1 * | 9/2003 | Kasatani | ............... | 257/778 |
| 6,770,980 B2 | 8/2004 | Shibata | | |
| 6,781,241 B2 * | 8/2004 | Nishimura et al. | ........... | 257/777 |
| 6,858,941 B2 | 2/2005 | Ference et al. | | |
| 7,061,122 B2 * | 6/2006 | Kim et al. | ............... | 257/778 |
| 2001/0004135 A1 | 6/2001 | Okamura | | |
| 2001/0028114 A1 * | 10/2001 | Hosomi | ............... | 257/778 |
| 2002/0030261 A1 * | 3/2002 | Rolda et al. | ............... | 257/685 |
| 2004/0227223 A1 | 11/2004 | Sawamoto | | |
| 2005/0040509 A1 | 2/2005 | Kikuchi et al. | | |
| 2005/0121764 A1 | 6/2005 | Mallik et al. | | |
| 2005/0146011 A1 | 7/2005 | Roper et al. | | |
| 2007/0108583 A1 | 5/2007 | Shim et al. | | |
| 2007/0216006 A1 | 9/2007 | Park et al. | | |
| 2007/0216008 A1 | 9/2007 | Gerber | | |
| 2007/0289777 A1 | 12/2007 | Pendse | | |
| 2007/0290319 A1 | 12/2007 | Kim | | |
| 2008/0006942 A1 | 1/2008 | Park et al. | | |
| 2008/0017967 A1 | 1/2008 | Bauer et al. | | |
| 2008/0029858 A1 | 2/2008 | Merilo et al. | | |

FOREIGN PATENT DOCUMENTS

JP 2004-047758 7/2002

* cited by examiner

*Primary Examiner*—Chris C Chu
(74) *Attorney, Agent, or Firm*—Weiss & Moy, P.C.

(57) ABSTRACT

A semiconductor device has a substrate. A semiconductor die is coupled to a first surface of the substrate. An encapsulate is placed over the semiconductor die. A first plurality of lands is formed on the first surface of the substrate around the encapsulate. A second plurality of lands is formed on a second surface of the substrate. A first group of the second plurality of lands has a pitch and a second group of the second plurality of lands has a pitch of a different length.

16 Claims, 3 Drawing Sheets

LAND PATTERNS FOR A SEMICONDUCTOR STACKING STRUCTURE AND METHOD THEREFOR

FIELD OF THE INVENTION

This invention relates to semiconductor devices and, more specifically, to a semiconductor device having land patterns on the top and bottom surfaces which match such that the ball pitches between the top and bottom land pads match where there are corresponding ball pad locations.

BACKGROUND OF THE INVENTION

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die or packages vertically in an IC package. Stacking multiple die or packages will maximize function and efficiency of the semiconductor package.

Stacked semiconductor packages are different from regular semiconductor packages in that they have land pads on both the top and bottom surfaces of the stacked semiconductor package. Due to the need for additional standoff height on a top surface of the stacked semiconductor package, the solder ball size, and hence pitch on the top surface needs to be rather large so that there is sufficient clearance between the stacked packages. However, the use of a large solder ball size is not feasible for the bottom surface of the stacked semiconductor package since this would lead to a solder ball count which would be fairly low.

Because of the above problem, present stacked packages use a ball pitch of one dimension for the top surface and a ball pitch of a second dimension for the bottom surface. The non-uniform ball pitch causes non-alignment of lands between the top surface and the bottom surface. This makes substrate design more complicated since metal traces will have more complex routings. Furthermore, non-uniform ball pitches require more complicated technologies like via-in pad to be used.

Therefore, a need existed to provide a device and method to overcome the above problem.

SUMMARY OF THE INVENTION

A semiconductor device has a substrate. A semiconductor die is coupled to a first surface of the substrate. An encapsulate is placed over the semiconductor die. A first plurality of lands is formed on the first surface of the substrate around the encapsulate. A second plurality of lands is formed on a second surface of the substrate. A first group of the second plurality of lands has a first pitch and a second group of the second plurality of lands has a second pitch.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
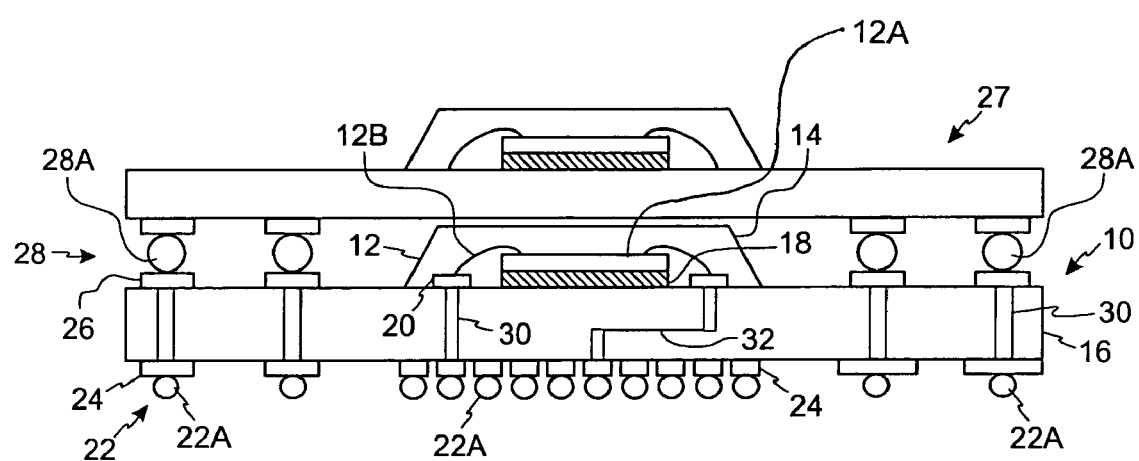
FIG. 1 is a cross-sectional view of one embodiment of the semiconductor device of the present invention.
Figure 2:
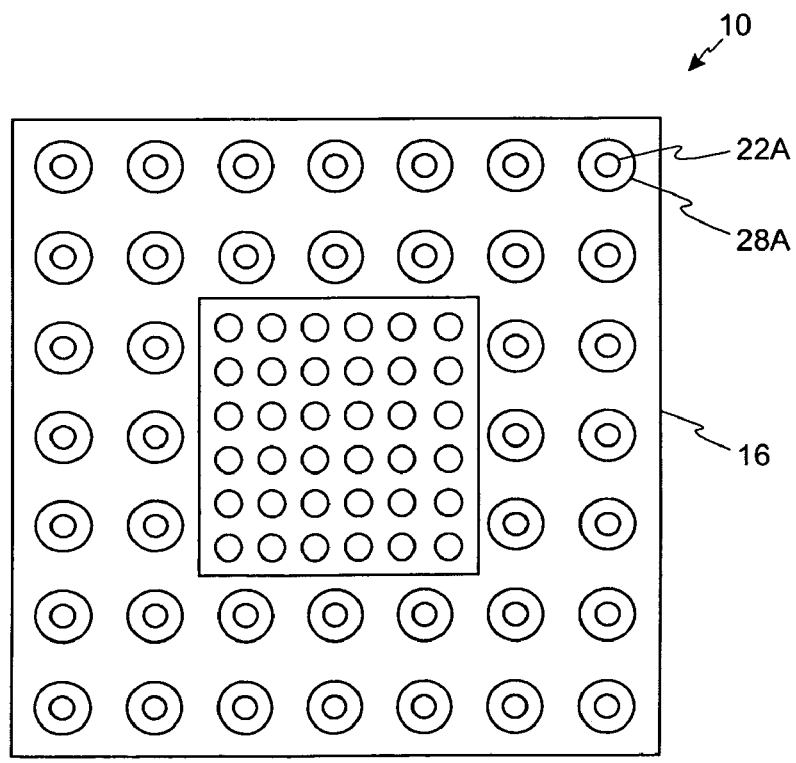
FIG. 2 is a top view of the semiconductor device depicted in FIG. 1.

Referring to FIGS. 1 and 2, a semiconductor device 10 is shown. The semiconductor device 10 has a device 12. The device 12 is coupled to a first surface of a substrate 16. The device 12 is encapsulated with a mold compound 14. The device 12 may be any type of device. For example, the device 12 may be a memory device, a logic device, an ASIC device, and other like elements. It should be noted that the listing of the above types of devices 12 is given as an example and should not be seen as to limit the scope of the present invention.

The device 12 has a semiconductor die 12A which is placed on the first surface of the substrate 16. An adhesive layer 18 is used to couple the semiconductor die 12A to the substrate 16. The adhesive layer 18 may be an adhesive film, an epoxy, or the like. The listing of the above adhesive layers 18 should not be seen as to limit the scope of the present invention. The semiconductor die 12A is then electrically coupled to the substrate 16. The semiconductor die 12A may be coupled to the substrate 16 through the use of wirebonds 12B. The wirebonds 12B are generally coupled to bond pad 20 formed on the first surface of the substrate 16. A mold compound 14 is then used to encapsulate the device 12.

Electrical contacts 22 are coupled to a second surface of the substrate 16. The electrical contacts 22 are used to provide an electrical connection to the stacking structure 10. The electrical contacts 22 may be a plurality of solder balls 22A as shown in FIG. 1. The solder balls 22A will be electrically coupled to the second surface of the substrate 16 via a first plurality of lands 24. In general, a reflow process may be used to couple the solder balls 22A to the second surface of the substrate 16. Alternative methods may be used to couple the solder balls 22A to the substrate 16 without departing from the spirit and scope of the present invention.

The substrate 16 has a second plurality of lands 26. The second plurality of lands 26 are formed on the first surface of the substrate 16. The lands 26 are used for stacking a second semiconductor device 27 on the semiconductor device 10. Electrical contacts 28 of the second semiconductor device 27 stacked on top of the semiconductor device 10 are coupled to the lands 26 on the first surface of the substrate 16. The electrical contacts 28 are used to provide an electrical connection between the semiconductor device 10 and the second semiconductor device 27. The electrical contacts 28 are generally a plurality of solder balls 28A. In general, a reflow process may be used to couple the solder balls 28A to the top surface of the substrate 16. Alternative methods may be used to couple the solder balls 28A to the substrate 16 without departing from the spirit and scope of the present invention.

In the prior art, a problem arose due to the non-uniform pitch between the lands on the top surface and the lands on the bottom surfaces of the substrate of the semiconductor stacking device. The non-uniform pitch caused non-alignment of the lands on the top surface and lands on the bottom surface of the substrate. The non-alignment of the lands make substrate design more complicated since metal traces will have more complex routings. Furthermore, non-uniform pitches require more complicated technologies like via-in pad to be used.

To overcome the above problems, the semiconductor device 10 employs a split pitch footprint for the lands 24 on the second surface of the substrate 16. The lands 24 along the outer perimeter of the second surface of the substrate 16 will be directly below a corresponding land 26 and will employ the same pitch as the land 26. In other words, the lands 26 of the first surface of the substrate 16 are aligned with a corresponding land 24 directly below. Thus, when the solder balls 28A are placed on the lands 26, the solder balls 28A will have the same pitch as a corresponding solder balls 22A located approximately directly below. The other lands 24 on the second surface of the substrate 16 which are located below the mold compound 14 will have a smaller/tighter pitch. Thus, the solder balls 22A located below the mold compound 14 will have a smaller pitch then the solder balls 22A that are aligned directly below the solder balls 28A that are outside the mold compound 16. This will allow for additional solder balls 22A to be placed in the area below the mold compound 14 thereby increasing the number of Input/Output (I/O) contacts.

In the embodiment depicted in FIG. 1, all of the lands 26 are coupled to a corresponding land 24 located approximately directly below. The lands 26 are not coupled to the semiconductor die 12A. This simplifies the substrate 16 by reducing the number of metal layers on the substrate 16 since connections are not required between the lands 26 and the semiconductor die 12A. In general, vias 30 are formed through the substrate 16. The vias 30 are used to couple the lands 26 on the first surface of the substrate 16 with a corresponding land 24 located approximately directly below.

The semiconductor die 12A may also be coupled to one or more lands 24. The semiconductor die 12A is generally coupled to one or more bond pads 20 via a wirebond 12B. The bond pads 20 are then coupled to a land 24 in one of several manners. First, the bond pads 20 may be coupled to a land 24 located directly below by a via 30 in a similar manner to that disclosed above. A via 30 is formed through the substrate 16 to directly couple the bond pad 20 to a land 24 located directly below. Alternatively, the bond pad 20 may be coupled to a corresponding land 24 in the following manner. Vias 30 are formed partially through the substrate 16 on both the first surface and the second surface of the substrate 16. The vias 30 which are formed partially through the substrate 16 are then coupled to one another through another metal layer 32 formed in the substrate 16. Thus, the metal layer 32 will couple the semiconductor die 12A to a land 24 located below the mold compound 14.

As shown in FIGS. 1 and 2, the semiconductor device 10 employs a split pitch footprint for the lands 24 on the second surface of the substrate 16. The lands 24 along the outer perimeter will be directly below the lands 26 and employ the same pitch as the lands 26. The lands 24 located below the mold compound 14 will have a smaller/tighter pitch. The split pitch footprint for the lands 24 allows the semiconductor device 10 to have a less complicate substrate 16. The substrate 16 is less complicated since the substrate 16 will have a reduced number of metal layers in order to couple the lands 24 along the outer perimeter to the lands 26 located directly below. The split pitch footprint further allows the semiconductor device 10 to increase the number of Input/Output (I/O) contacts. Since the lands 24 located below the mold compound 14 will have a tighter pitch, additional lands 24 may be placed on the second surface of the substrate 16 thereby increasing the total number of I/O contacts on the second surface of the substrate 16.

Figure 3:
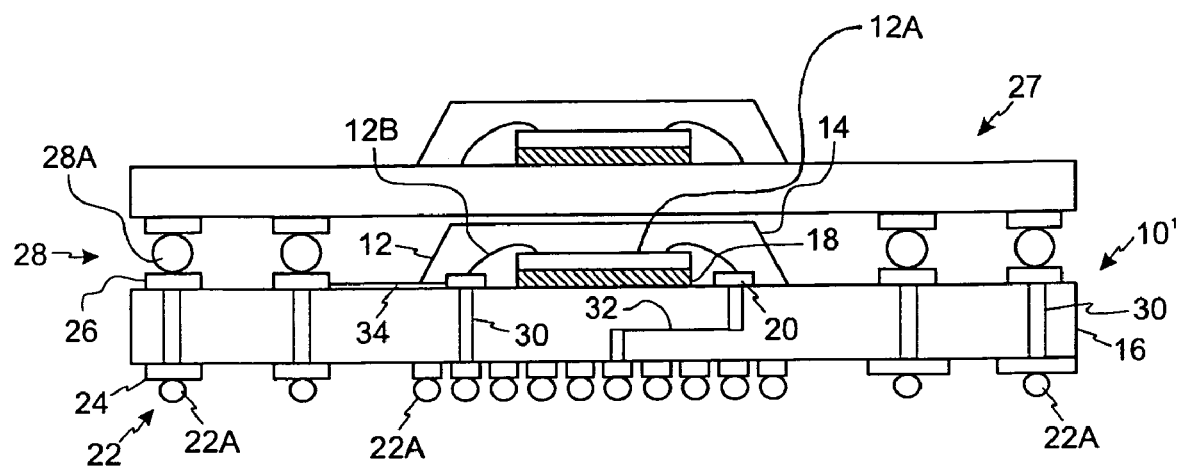
FIG. 3 is a cross-sectional view of another embodiment of the present invention.
Figure 4:
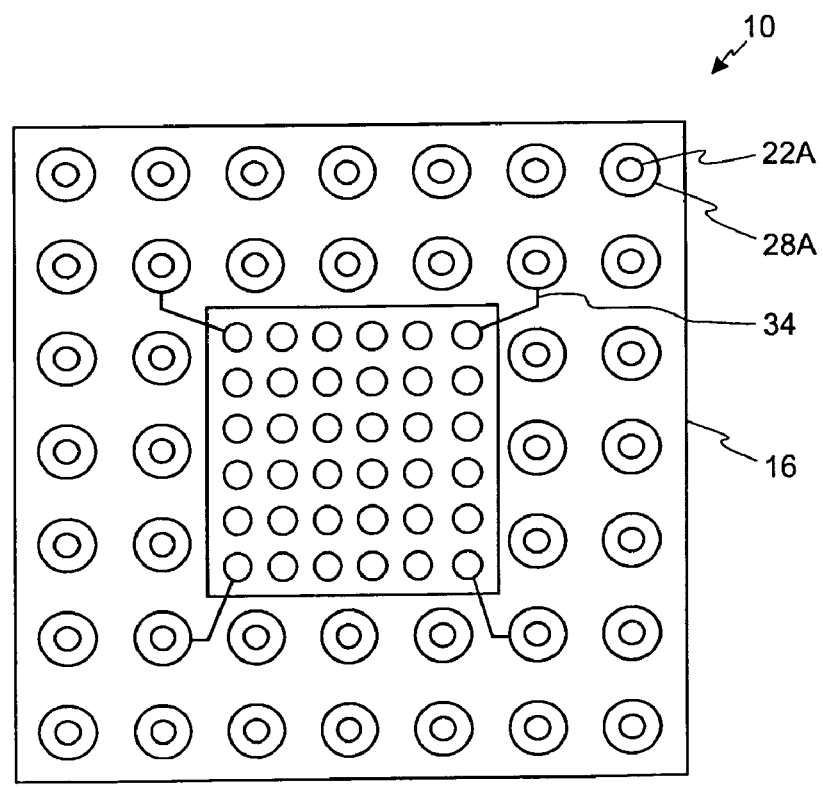
FIG. 4 is a top view of the embodiment depicted in FIG. 3.

Referring now to FIGS. 3 and 4, another embodiment of the semiconductor device 10' is shown. The semiconductor device 10' is similar to that shown in FIG. 1, thus only the differences will be discussed. In FIG. 3, the lands 26 on the first surface of the substrate 16 are still aligned with a corresponding land 24 directly below. However, at least one of the lands 26 is also coupled to the semiconductor die 12A. Metal traces 34 formed in the substrate 16 will couple one or more lands 26 on the first surface of the substrate 16 to the semiconductor die 12A. In general, bond pads 20 are coupled to the semiconductor die 12A through the use of wirebonds 12B. The metal traces 34 formed in the substrate 16 will then couple the land 26 on the first surface of the substrate 16 to the bond pads 20. As seen in FIG. 3, the semiconductor device 10' still employs a split pitch footprint for the lands 24. The lands 24 along the outer perimeter will be directly below lands 26 and employ the same pitch as the lands 26. The lands 24 located below the mold compound will still have a smaller/tighter pitch.

Figure 5:
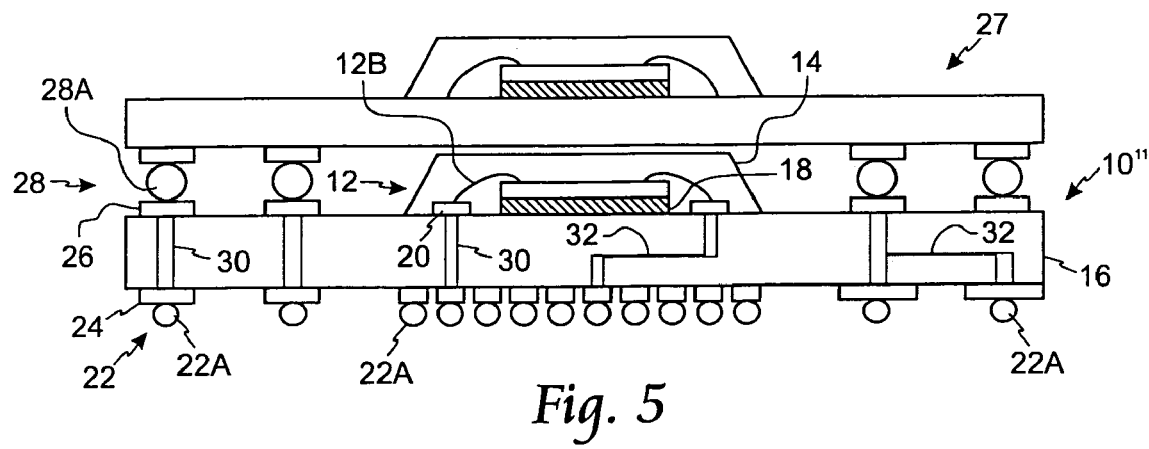
FIG. 5 is a cross-sectional view of another embodiment of the present invention.

Referring now to FIG. 5, another embodiment of the semiconductor device 10" is shown. The semiconductor device 10" is similar to the embodiments shown above, thus only the differences will be discussed. The main difference in the semiconductor device 10" is that one or more lands 26 may not be coupled to a corresponding land 24. Furthermore, the one or more lands 26 that may not be coupled to a corresponding land 24 may further not be coupled to the semiconductor device.

Figure 6:
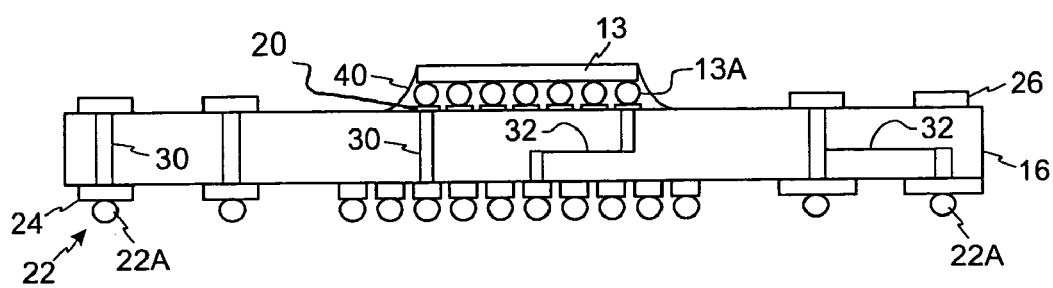
FIG. 6 is a is a cross-sectional view of yet another embodiment of the present invention.

Referring now to FIG. 6, in the stacking structures of the previous embodiments, the semiconductor die 12A is electrically coupled to the substrate 16 through the use of wirebonds 12B. However, a semiconductor die 12A may be a flip chip 13 in any of the above embodiments. In using a flip chip 13, the bumps 13A of the flip chip 13 are placed on the bond pads 20. The stacking structure 10 is heated to make a solder connection between the bumps 13A and the bond pads 20. The remaining space under the flip chip 13 is then filled with an electrically non-conductive material 40. The bond pads 20 may be coupled to a land 24 located directly below by a via 30 as disclosed above. Alternatively, bond pads 20 may be coupled to a corresponding land 24 by having vias 30 formed partially through the substrate 16 on both the first surface and the second surface of the substrate 16. The vias 30 which are formed partially through the substrate 16 are then coupled to one another through another metal layer 32 formed in the substrate 16.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

The invention claimed is:
1. A semiconductor device comprising:
a substrate;
a semiconductor die coupled to a first surface of the substrate;
a first plurality of lands on the first surface of the substrate around an encapsulate; and
a second plurality of lands on a second surface of the substrate, wherein a first group of the second plurality of lands have a pitch and a second group of the second plurality of lands have a pitch of a different distance;

wherein each of the first plurality of lands is coupled to a corresponding land of the first group of the second plurality of lands;

wherein the semiconductor die is electrically coupled to at least one of the first plurality of lands and to one of the second group of the second plurality of lands.

2. A semiconductor device in accordance with claim 1, wherein the pitch of the first group of the second plurality of lands have a larger pitch than the pitch of the second group of the second plurality of lands.

3. A semiconductor device in accordance with claim 1, wherein the first group of the second plurality of lands are aligned with the first plurality of lands on the first surface of the substrate.

4. A semiconductor device in accordance with claim 1, wherein a pitch of the first plurality of lands is approximately the same as the pitch of the first group of the second plurality of lands.

5. A semiconductor device in accordance with claim 1, wherein each of the first plurality of lands is coupled to a corresponding land of the first group of the second plurality of lands by a via formed in the substrate.

6. A semiconductor device in accordance with claim 1, wherein the second group of the second plurality of lands is positioned below an encapsulant used to encapsulate the semiconductor die.

7. A semiconductor device in accordance with claim 1, further comprising:
   a first via coupled to the semiconductor device;
   a second via coupled to at least one of the second group of the second plurality of lands; and
   a metal trace formed in the substrate to coupled the first via to the second via to electrically couple the semiconductor die to one of the second group of the second plurality of lands.

8. A semiconductor device comprising:
   a substrate;
   a semiconductor die coupled to a first surface of the substrate;
   a first plurality of lands on the first surface of the substrate around an encapsulate; and
   a second plurality of lands on a second surface of the substrate, wherein a first group of the second plurality of lands are positioned below and coupled to the first plurality of lands, and a second group of the second plurality of lands are partially positioned below the semiconductor die;
   wherein each of the first plurality of lands is coupled to a corresponding land of the first group of the second plurality of lands, and wherein the semiconductor die is electrically coupled to at least one of the first plurality of lands and to one of the second group of the second plurality of lands;
   wherein a pitch of the first group of the second plurality of lands is larger than a pitch of the second group of the second plurality of lands;
   wherein a pitch of the first plurality of lands is approximately the same as the pitch of the first group of the second plurality of lands.

9. A semiconductor device in accordance with claim 8 wherein the second group of the second plurality of lands is positioned below an encapsulant used to encapsulate the semiconductor die.

10. A semiconductor device in accordance with claim 8, wherein each of the first plurality of lands is coupled to a corresponding land of the first group of the second plurality of lands by a via formed in the substrate.

11. A semiconductor device comprising:
   a substrate;
   a semiconductor die coupled to a first surface of the substrate;
   means formed on the first surface of the substrate around an outer perimeter of an encapsulate for providing electrical connections; and
   means formed on a second surface of the substrate for providing electrical connections, wherein a first group of means formed on the second surface of the substrate have a first pitch and a second group of means formed on the second surface of the substrate have a second pitch of a different distance;
   wherein the semiconductor die is electrically coupled to at least one of the means formed on the first surface and to one of the second group of means formed on the second surface of the substrate.

12. A semiconductor device in accordance with claim 11, wherein the first pitch is greater than the second pitch.

13. A semiconductor device in accordance with claim 11, wherein the first group means formed on the second surface of the substrate is aligned with the means formed on the first surface of the substrate.

14. A semiconductor device in accordance with claim 11, wherein a pitch of the means formed on the first surface of the substrate is approximately equal to the first pitch of the first group of means formed on the second surface of the substrate.

15. A semiconductor device in accordance with claim 11, wherein each of the means formed on the first surface of the substrate is exclusively coupled to a corresponding first group of means formed on the second surface of the substrate by a via formed in the substrate.

16. A semiconductor device in accordance with claim 11, further comprising metal traces formed on the substrate to electrically couple the semiconductor die to at least one of the means formed on the first surface.

\* \* \* \* \*